United States Patent
Ko et al.

(10) Patent No.: US 9,005,709 B2
(45) Date of Patent: Apr. 14, 2015

(54) METHOD FOR FABRICATING TRANSFER PRINTING SUBSTRATE USING CONCAVE-CONVEX STRUCTURE, TRANSFER PRINTING SUBSTRATE FABRICATED THEREBY AND APPLICATION THEREOF

(71) Applicant: Gwangju Institute of Science and Technology, Buk-gu, Gwangju (KR)

(72) Inventors: Heung Cho Ko, Gwangju (KR); Seok Ho Kim, Gwangju (KR); Jongwon Yoon, Gwangju (KR); Young Kyu Hwang, Gwangju (KR); Su Ok Yun, Gwangju (KR); Hun Soo Jang, Gwangju (KR); Seong-Ju Park, Gwangju (KR); Hyun-A Cho, Gwangju (KR); Byeong-Il Noh, Gwangju (KR); Jaeyi Chun, Gwangju (KR)

(73) Assignee: Gwangju Institute of Science and Technology, Gwangju (KR)

( * ) Notice: Subject to any disclaimer, the term of this patent is extended or adjusted under 35 U.S.C. 154(b) by 23 days.

(21) Appl. No.: 13/712,026

(22) Filed: Dec. 12, 2012

(65) Prior Publication Data

US 2013/0171337 A1 Jul. 4, 2013

(30) Foreign Application Priority Data

Dec. 19, 2011 (KR) .................. 10-2011-0137726
Sep. 3, 2012 (KR) .................. 10-2012-0097372

(51) Int. Cl.

| B32B 38/10 | (2006.01) |
| B32B 3/30 | (2006.01) |
| B41C 1/00 | (2006.01) |
| G03F 7/00 | (2006.01) |
| B82Y 10/00 | (2011.01) |
| B82Y 40/00 | (2011.01) |
| B41N 1/12 | (2006.01) |

(52) U.S. Cl.
CPC . *B32B 38/10* (2013.01); *B32B 3/30* (2013.01); *B41C 1/00* (2013.01); *B41N 1/12* (2013.01); *G03F 7/0002* (2013.01); *B82Y 10/00* (2013.01); *B82Y 40/00* (2013.01)

(58) Field of Classification Search
None
See application file for complete search history.

(56) References Cited

U.S. PATENT DOCUMENTS

| 2006/0183395 A1* | 8/2006 | Xu et al. .................. 445/50 |
| 2009/0039560 A1* | 2/2009 | Nishikawa et al. ........... 264/427 |
| 2009/0236310 A1* | 9/2009 | Linder et al. .................. 216/49 |
| 2010/0317132 A1* | 12/2010 | Rogers et al. .................. 438/27 |

\* cited by examiner

*Primary Examiner* — Michael Cleveland
*Assistant Examiner* — Lisha Jiang
(74) *Attorney, Agent, or Firm* — Nath, Goldberg & Meyer; Joshua B. Goldberg; Sheldon M. McGee

(57) ABSTRACT

A method for fabricating a substrate for transfer printing using a concave-convex structure and a substrate for transfer printing fabricated thereby. The method includes preparing a handling substrate having a concave-convex structure formed thereon; forming a sacrificial layer along the concave-convex structure on the handling substrate; coating a polymer on the handling substrate having the sacrificial layer formed thereon to form a polymer substrate having bumps filling a concave portion of the concave-convex structure; and removing the sacrificial layer from the handling substrate. The substrate includes a handling substrate having a concave-convex structure formed thereon; and a polymer substrate placed on the concave-convex structure and having bumps filling a concave portion of the concave-convex structure of the handling substrate. This process of manufacturing provides a device to be stably performed on an ultrathin substrate and may secure high degree of alignment and high transfer yield in a transfer printing process.

20 Claims, 16 Drawing Sheets

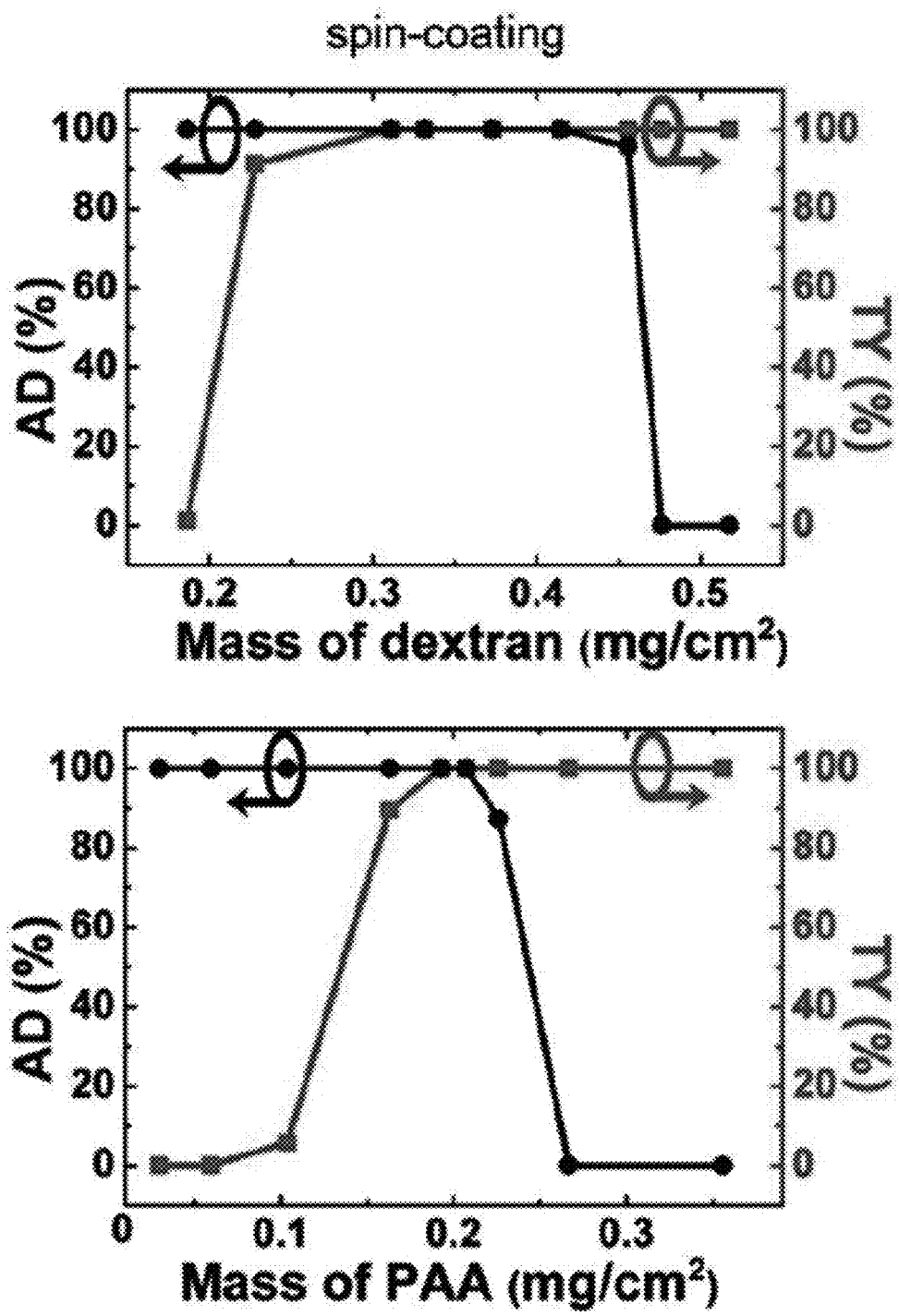

METHOD FOR FABRICATING TRANSFER PRINTING SUBSTRATE USING CONCAVE-CONVEX STRUCTURE, TRANSFER PRINTING SUBSTRATE FABRICATED THEREBY AND APPLICATION THEREOF

CROSS-REFERENCE TO RELATED APPLICATION

This application claims priority to Korean Patent Application Nos. 10-2011-0137726 and 10-2012-0097372 filed on Dec. 19, 2011 and Sep. 3, 2012, and all the benefits accruing therefrom under 35 U.S.C. §119, the contents of which are incorporated by reference in their entirety.

BACKGROUND

1. Technical Field

The present invention relates to a method for fabricating a substrate for transfer printing and a substrate for transfer printing fabricated thereby. More particularly, the present invention relates to a method for fabricating a substrate for transfer printing using a handling substrate having a concave-convex structure, a substrate for transfer printing fabricated thereby, and application thereof.

2. Description of the Related Art

As future electric/electronic devices are required to be mounted not only on simple planar surfaces, but also on various surfaces, such as skin surfaces, clothes surfaces, interior or exterior surfaces of buildings, body surfaces of persons, and the like, the devices need to have highly mechanical flexibility. Since flexibility of the devices can be easily obtained through a smaller thickness thereof, substrates used for the devices are required to have as small a thickness as possible. However, when the thickness of the substrate decreases to several micrometers or less, the substrate inevitably undergoes twisting or other deformation due to mechanical flexibility of the substrate in the course of processing. Thus, a handling substrate is used to support an ultrathin substrate in order to secure process stability. In this case, however, a process of transferring a thin film type device formed on the ultrathin substrate through separation from the handling substrate to transfer the device to another surface is required. At this time, alignment and transfer yield are very important. In this regard, it is important to take three factors into account: first, the ultrathin substrate must retain mechanical stability in the manufacturing process; secondly, an initial arrangement pattern of the ultrathin substrate must be maintained in the manufacture and transfer printing processes of the device; and thirdly, transfer printing must be performed at high yield.

In one example of transfer printing, an ultrathin substrate is directly coated on the handling substrate. Although this method can provide process stability, there can be difficulty in transfer of the ultrathin substrate to another substrate due to high adhesion force between the handling substrate and the ultrathin substrate. Accordingly, it can be contemplated that a device is fabricated on the ultrathin substrate, with a sacrificial layer interposed between the handling substrate and the ultrathin substrate, and is then transferred after removing the sacrificial layer from the handling substrate. However, when removing the sacrificial layer using an etching solution, the pattern of the ultrathin substrate placed on the handling substrate floats causing loss of initial arrangement, and sinks into the handling substrate causing deterioration of transfer yield. Meanwhile, in another method, an insulation layer can be interposed between the handling substrate and the ultrathin substrate to allow the device to be separated from the handling substrate upon laser irradiation, causing increase in manufacturing cost and a possibility of damaging the device by a laser beam. Moreover, this method suffers from performance deterioration of the device due to formation of an uneven surface upon detachment from the handling substrate.

Therefore, there is a need for a method of manufacturing a device on an ultrathin substrate, which can maximize the degree of alignment and transfer yield of the device in the course of transfer printing, while securing process stability.

BRIEF SUMMARY

Therefore, the present invention is aimed at providing a substrate for transfer printing and a method of manufacturing the same, which are useful in realization of high degree of alignment and transfer yield while minimizing damage of devices.

One aspect of the present invention provides a method for fabricating a substrate for transfer printing. The method for fabricating a substrate for transfer printing includes: preparing a handling substrate having a concave-convex structure formed thereon; forming a sacrificial layer along the concave-convex structure on the handling substrate; coating a polymer on the handling substrate having the sacrificial layer formed thereon to form a polymer substrate having bumps filling a concave portion of the concave-convex structure; and removing the sacrificial layer from the handling substrate.

Another aspect of the present invention provides a substrate for transfer printing. The substrate for transfer printing includes a handling substrate having a concave-convex structure formed thereon; and a polymer substrate placed on the concave-convex structure and having bumps filling a concave portion of the concave-convex structure of the handling substrate.

A further aspect of the present invention provides a method for fabricating an electronic device for transfer printing. The method for fabricating an electronic device for transfer printing includes: preparing a handling substrate having a concave-convex structure formed thereon; forming a sacrificial layer along the concave-convex structure on the handling substrate; coating a polymer on the handling substrate having the sacrificial layer formed thereon to form a polymer substrate having bumps filling a concave portion of the concave-convex structure; and removing the sacrificial layer from the handling substrate, wherein an electronic device is formed on the polymer substrate before or after removing the sacrificial layer.

According to the present invention, since the polymer substrate is structurally bound to the handling substrate having a concave-convex structure formed thereon, arrangement of the polymer substrate can be firmly maintained even in the case of removing the sacrificial layer from between the polymer substrate and the handling substrate.

In addition, even in the case where the sacrificial layer is removed, the handling substrate is not in complete contact with the polymer substrate to reduce adhesion force therebetween, thereby allowing easy transfer to a transfer medium.

Further, the process of manufacturing a device can be stably performed on the polymer substrate, and, when components of the device is vulnerable to an etching solution used in removal of the sacrificial layer, the process of removing the sacrificial layer may be performed before manufacturing the device to prevent damage of the device.

Meanwhile, a water soluble polymer may be employed as a material for the sacrificial layer and a non-toxic material such as water may be employed as an etching solution. In this case, there will be no problem of damage of the polymer substrate and the device due to the etching solution. As a result, the process of removing the sacrificial layer may be performed after manufacturing the device on the polymer substrate.

BRIEF DESCRIPTION OF THE DRAWINGS

The above and other aspects, features, and advantages of the present invention will become apparent from the detailed description of the following embodiments in conjunction with the accompanying drawings, in which:

FIGS. 15a and 15b are graphs depicting degree of alignment (AD) and transfer yield (TY) measured in Example 6;

DETAILED DESCRIPTION

Figure 1:
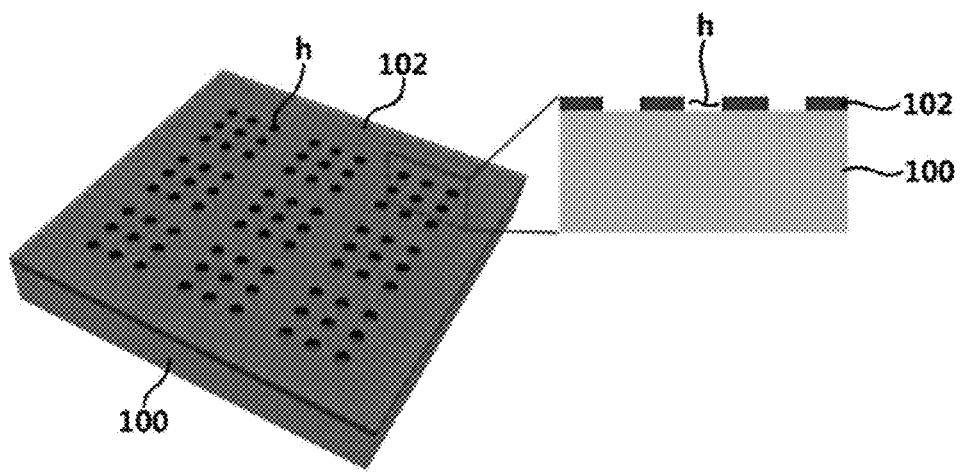
FIGS. 1 to 5 are perspective views and sectional views illustrating sequences of a method for fabricating a substrate for transfer printing according to one embodiment of the present invention.

Exemplary embodiments of the present invention will now be described in detail with reference to the accompanying drawings. However, it should be noted that the present invention may be embodied in various different forms without being limited to the illustrated embodiments and is intended to embrace all equivalents and substitutions that fall within the spirit and scope of the appended claims. In the drawings, the thicknesses of layers and regions can be exaggerated or omitted for clarity. The same components will be denoted by the same reference numerals throughout the specification. Furthermore, descriptions of details apparent to those skilled in the art will be omitted for clarity.

FIGS. 1 to 5 are perspective views and sectional views illustrating sequences of a method for fabricating a substrate for transfer printing according to one embodiment of the present invention.

Figure 2:
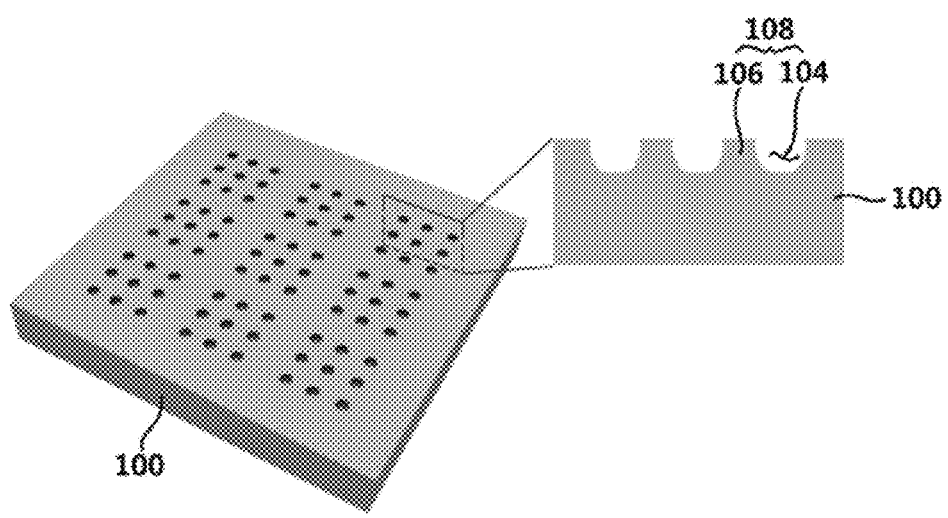

Referring to FIGS. 1 and 2, a photoresist layer 102 having a pattern of plural holes (h) is formed on a handling substrate 100 (FIG. 1). The handling substrate 100 is etched along the holes (h) on the photoresist layer 102 and the remaining photoresist layer is removed to form a concave-convex structure 108 on the handling substrate 100 (FIG. 2).

The handling substrate 100 may be a glass or silicon substrate, without being limited thereto. The photoresist layer 102 may be formed by any typical photolithography, and the handling substrate 100 may be etched by various etching methods according to the kind of substrate. For example, when the handling substrate 100 is a glass substrate, an etching solution such as BOE (Buffered Oxide Etchant) may be used. When the handling substrate 100 is a silicon substrate, dry etching, for example, reactive ion etching (RIE), may be used. In particular, when the handling substrate 100 is etched by reactive ion etching, there is an advantage in that the concave-convex structure 108 can be rapidly formed to a desired shape and size, since physical etching and chemical etching are performed at the same time.

In the concave-convex structure 108, a concave portion 104 may be formed in various shapes. For example, the concave portion 104 may have circular, elliptical, polygonal and other geometrical cross-sections (that is, a cross-section of the handling substrate 100 in a horizontal direction). In addition, the concave portion 104 may have a pot-shaped longitudinal cross-section (that is, a cross-section of the handling substrate 100 in a vertical direction), an inlet of which is smaller than a belly thereof.

In operation of preparing the handling substrate 100 having a concave-convex structure 108 thereon, the concave-convex structure 108 may be formed on the surface of the handling substrate 100 using a mask for etching together with the photoresist layer 102 described above. Alternatively, a handling substrate 100 having the concave-convex structure 108 previously formed thereon may be used.

Figure 3:
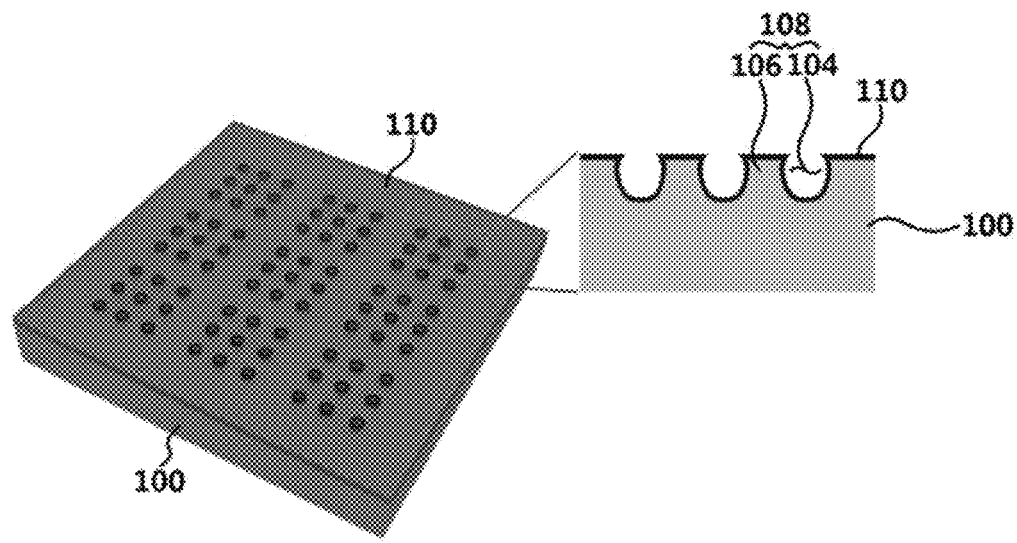

Referring to FIG. 3, a sacrificial layer 110 is formed on the handling substrate 100 along the concave-convex structure 108. Specifically, the sacrificial layer 110 is formed along morphology of the concave-convex structure 108 and does not substantially change the shape of the concave portion 104.

The sacrificial layer 110 may be an inorganic or organic thin film. For example, the sacrificial layer 110 may be a thin film comprised of a material selected from inorganic oxides such as $SiO_2$ and phosphor silicate; polymers such as polyacrylic acid (PAA), polymethyl methacrylate (PMMA), polystyrene (PS) and dextran; and metals such as nickel, copper, chromium, titanium, silver, and aluminum. The sacrificial layer 110 may be formed by a deposition process such as sputtering, PECVD, electronic-beam deposition, and thermal deposition, or a solution process such as spin coating or spray coating, according to the material used for the sacrificial layer.

The sacrificial layer 110 formed on an upper surface of the convex portion 106 of the concave-convex structure may have a higher thickness than that of the sacrificial layer 110 formed on a lower surface of the concave portion 104 of the concave-convex structure. Such a thickness difference occurs since it is more spatially disadvantageous for a raw material for forming the sacrificial layer 110 to approach the lower surface of the concave portion 104 of the concave-convex structure than the upper surface of the convex portion 106 of the concave-convex structure.

Figure 4:
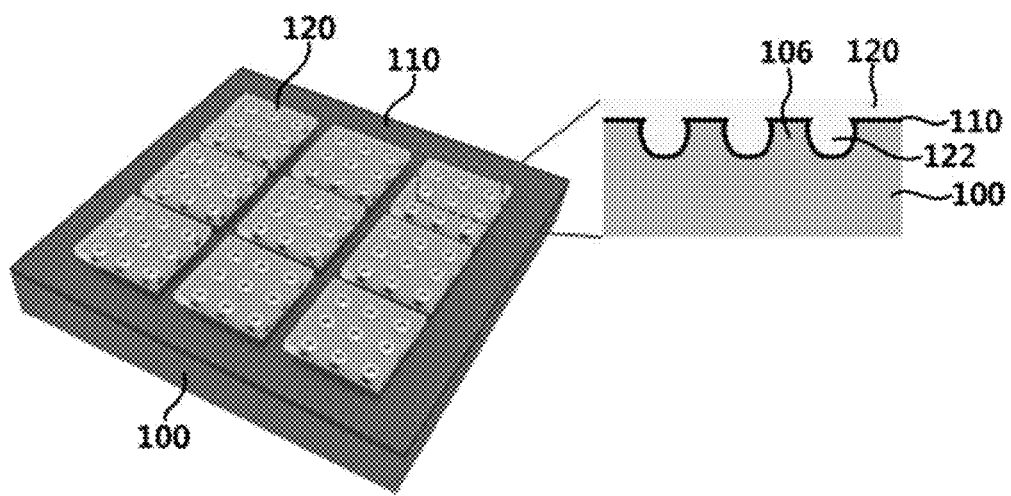

Referring to FIG. 4, a polymer is coated on the handling substrate 100, which has the sacrificial layer 110 formed thereon, to form a polymer substrate which has bumps 122 filling the concave portion 104 of the concave-convex structure while covering the handling substrate 100. A process of coating the polymer may be performed by wet coating such as spin coating using a solution containing the polymer. In the course of coating the polymer, the concave portion 104 of the concave-convex structure is filled with the polymer, which in turn forms the bumps 122 having a shape corresponding to the shape of the concave portion 104.

The polymer may be selected from polyethylene terephthalate (PET), polyethersulfone (PES), polystyrene (PS), polycarbonate (PC), polyimide (PI), polyethylene naphthalate (PEN), polyarylates (PAR), SU-8, and the like, without being limited thereto.

The polymer substrate may be subjected to patterning to have a desired shape and arrangement. In one embodiment, the polymer substrate may be used as a parent substrate, which will be divided into a plurality of polymer substrates 120 having a smaller size than the parent substrate through patterning. In this case, each of the polymer substrates 120 includes at least one bump 122 inserted into the concave portion 104 of the concave-convex structure and may be maintained at an original place in a subsequent process for removing the sacrificial layer 122 or manufacturing a device on the polymer substrate 120, as described below. The patterning process may be suitably carried out by any typical method known in the art according to the characteristics of the material for the polymer substrate 120. For example, when a linear polymer such as PI is used for the polymer substrate, reactive ion etching may be employed, and when an optical cross-linkable polymer such as SU-8 is used for the polymer substrate, photolithography may be employed.

Figure 5:
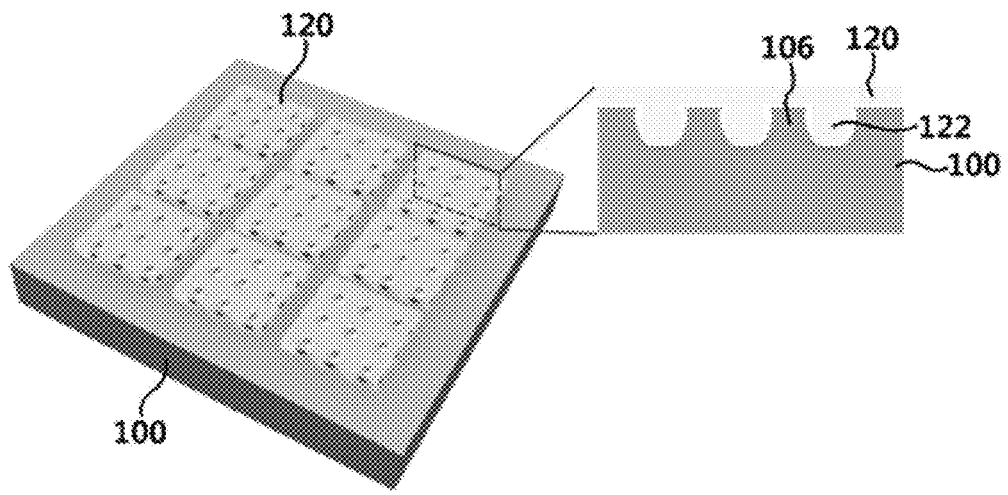

Referring to FIG. 5, the sacrificial layer interposed between the handling substrate 100 and the polymer substrate 120 is removed. Removal of the sacrificial layer 110 may be achieved by wet etching. The wet etching may be performed using any etching solution capable of selectively removing the sacrificial layer without damaging the polymer substrate 120. For example, the etching solution may be suitably selected from water, HF solution, acetone, $FeCl_3$ solution, sodium persulfate solution, toluene, and a mixture of phosphoric acid/nitric acid/acetic acid/water.

In this case, since the bumps 122 of the polymer substrate 120 are inserted into the concave portion 104 of the handling substrate 100 even after removal of the sacrificial layer 110, the polymer substrate 120 is not deviated from the original place thereof. Thus, the arrangement pattern of the polymer substrates 120 can be maintained.

In particular, when the concave portion 104 of the concave-convex structure has a pot-shaped longitudinal cross-section, the inlet of which is smaller than the belly thereof, the location of the polymer substrate 120 can be more firmly maintained. That is, a neck of the concave portion 104 of the concave-convex structure corresponding to a portion between the belly and the inlet of the concave portion can hold the belly of the convex portion 122 of the polymer substrate 120 (that is, a portion having the largest circumference of the convex portion) corresponding to the shape of the concave portion 104.

Meanwhile, irrespective of the longitudinal cross-sectional shape of the concave portion 104, when a polymer such as polyacrylic acid (PAA) and dextran is used as a material for the sacrificial layer 110, the polymer substrate 120 may be held by adhesion of the polymer constituting the sacrificial layer 110. In the process of etching the sacrificial layer 110, the polymer of the sacrificial layer 110 placed within the concave portion 104 of the convex-concave structure is etched at a slower rate than the polymer of the sacrificial layer 110 placed in other regions thereof, whereby the polymer can be concentrated on and remain in the concave portion 104 of the concave-convex structure upon drying. Such a phenomenon may occur due to topological confinement of the remaining sacrificial layer polymer within and around the concave portion 104 of the concave-convex structure. The remaining polymer of the sacrificial layer 110 may hold the polymer substrate 120 with suitable adhesion. Thus, since the remaining amount of the polymer of the sacrificial layer 110 may be adjusted by regulating the degree of etching of the sacrificial layer 110, it is possible to easily adjust adhesion between the handling substrate 100 and the polymer substrate 120.

In addition, since the polymer substrate 120 is prepared by the process of forming the polymer substrate on the sacrificial layer 110 and removing the sacrificial layer 110, instead of the process of directly forming the polymer substrate on the handling substrate 100, adhesion between both substrates 110, 120 can be lower than the adhesion therebetween in the case of directly forming the polymer substrate 120 on the handling substrate 110.

Further, even in the case where the sacrificial layer 110 is removed, the polymer substrate 120 does not sink into the handling substrate 100 to be brought into complete contact therewith, and at least part of the polymer substrate 120 having contacted the sacrificial layer 110 may be present in a state of being separated from the handling substrate 100. This is because the polymer substrate 120 can be floated by the etching solution present in a space from which the sacrificial layer 110 is removed. However, even in the case where the etching solution is removed by drying, the polymer substrate 120 is supported by the bumps 122, for example, when the bumps 122 of the polymer substrate 120 have a greater height than the depth of the concave portion 104 of the concave-convex structure (this structure can appear when the thickness of the sacrificial layer 110 formed on the upper surface of the convex portion 106 of the concave-convex structure is higher than that of the sacrificial layer 110 formed on the lower surface of the concave portion 104 of the concave-convex structure, as described with reference to FIG. 3), whereby a separation space can be defined in at least some region between the convex portion 106 of the concave-convex structure and the polymer substrate 120. In another example, the belly of the bump 122 of the polymer substrate 120 is caught by a certain portion of the concave portion 104 of the concave-convex structure having a smaller size than the belly of the bump 122, thereby preventing the polymer substrate 120 from completely sinking into the handling substrate 100. In a further example, when a polymer is used as the material for the sacrificial layer 120, the sacrificial layer 120 is not completely removed by etching and remains within or around the concave portion 104 of the concave-convex structure, thereby preventing the polymer substrate 120 from sinking into the handling substrate 100 and directly contacting the handling substrate 100. Consequently, in the method according to the present invention, a separation space is defined in at least some region between the handling substrate 100 and the polymer substrate 120. Particularly, the separation space may be defined in at least some region between the upper surface of the convex portion 106 of the concave-convex structure formed on the handling substrate 100 and the lower surface of the polymer substrate 120.

Figure 6:
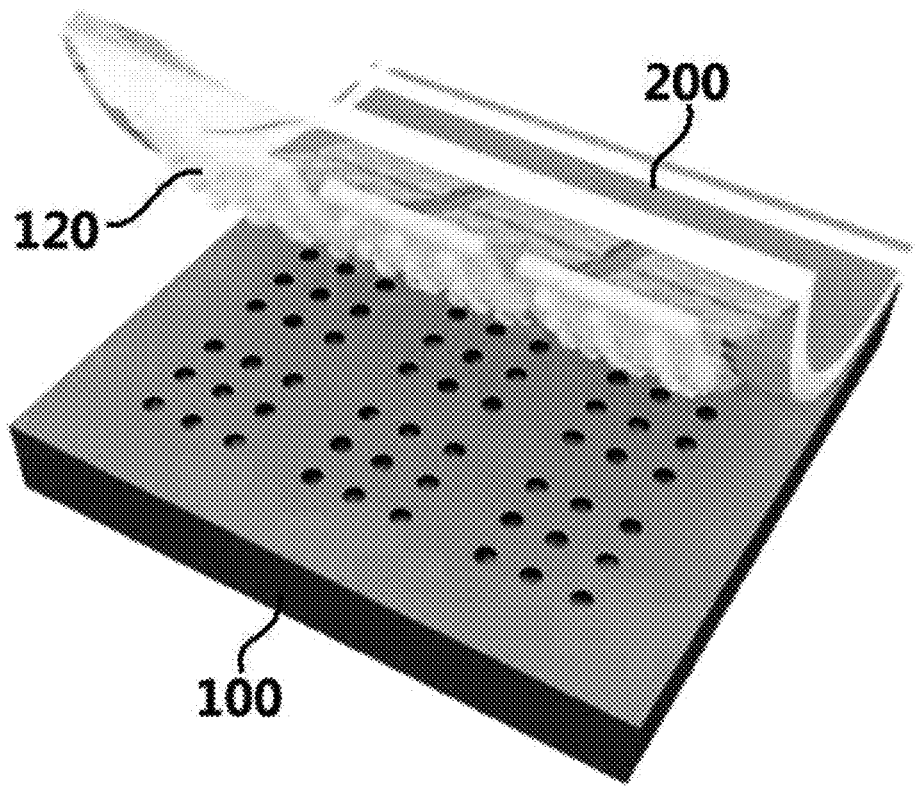
FIG. 6 is a perspective view of a process of transferring a polymer substrate from a handling substrate to a transfer medium.

Thus, due to reduced adhesion between the handling substrate 100 and the polymer substrate 120, the polymer substrate 120 can be easily separated from the handling substrate 110 and transferred to a transfer medium 200 in the course of bringing the polymer substrate 120 into contact with the transfer medium 200 such as an elastomeric stamp or an adhesive film and separating the polymer substrate 120 therefrom, as shown in FIG. 6.

In accordance with another aspect, the present invention provides a substrate for transfer printing fabricated by the method as described above. The substrate for transfer printing includes a handling substrate having a concave-convex structure formed thereon; and a polymer substrate placed on the concave-convex structure and having bumps filling a concave portion of the concave-convex structure of the handling substrate.

In one embodiment, the concave-convex structure may have a concave portion having a pot-shaped longitudinal cross-section, an inlet of which is smaller than a belly thereof, and the bumps of the polymer substrate have a shape corresponding to the shape of the concave portion of the concave-convex structure.

In one embodiment, a separation space may be defined in at least some region between the handling substrate and the polymer substrate.

In one embodiment, a separation space may be defined in at least some region between an upper surface of the convex portion of the concave-convex structure and a lower surface of the polymer substrate.

In one embodiment, the polymer substrate may be comprised of substrates divided from each other in a predetermined pattern, and each of the divided substrates may be caught by the concave portion of the concave-convex structure via by the bumps such that arrangement of the divided substrates can be maintained.

In one embodiment, a water-soluble polymer may be interposed between the handling substrate and the polymer substrate at least within the concave portion of the concave-convex structure to act as an interface adhesion material between the handling substrate and the polymer substrate.

In accordance with a further aspect, the present invention provides a method for fabricating an electronic device for transfer printing. The method for fabricating an electronic device for transfer printing includes: preparing a handling substrate having a concave-convex structure formed thereon; forming a sacrificial layer along the concave-convex structure on the handling substrate; coating a polymer on the handling substrate having the sacrificial layer formed thereon to form a polymer substrate having bumps filling a concave portion of the concave-convex structure; and removing the sacrificial layer from the handling substrate, wherein an electronic device is formed on the polymer substrate before or after removing the sacrificial layer.

In consideration of conditions for removing the sacrificial layer and convenience in manufacture of the device, the operation of forming the device on the polymer substrate may be suitably determined before or after removing the sacrificial layer. For example, when the sacrificial layer is removed using an etching solution such as hydrogen fluoride HF, which can damage the device, it is preferable to form the device after removing the sacrificial layer. However, when a water soluble polymer is used as the material for the sacrificial layer and water is used as the etching solution for the sacrificial layer, removal of the sacrificial layer may be performed after forming the device, since there is no problem of damaging the device by the etching solution. Since the adhesion between the handling substrate and the polymer substrate is stronger in the case in which the sacrificial layer is not removed than in the case in which the sacrificial layer is removed, the device can be more easily formed on the polymer substrate without loss of the degree of alignment of the polymer substrate when the sacrificial layer is not removed.

In accordance with a further aspect, the present invention provides a method of transfer printing a polymer substrate (or an electronic device formed on the polymer substrate together with the polymer substrate) to a target substrate using a polymer for transfer printing.

Figure 7:
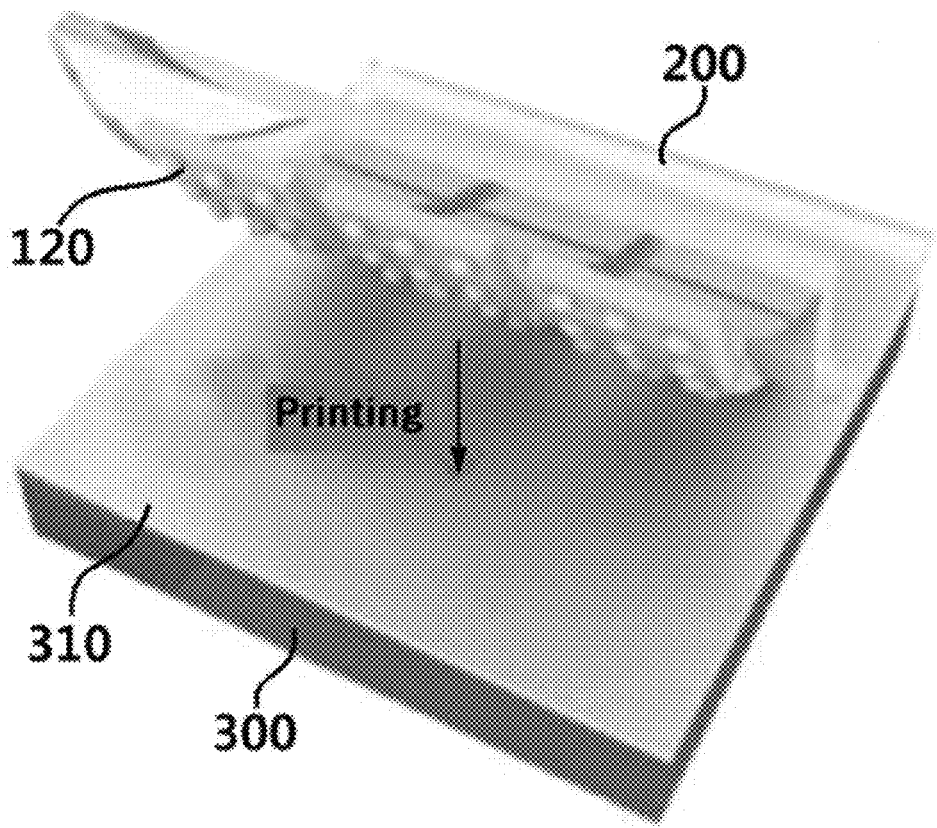
FIG. 7 is a perspective view of a process of printing the polymer substrate from the transfer medium to a target substrate.

As described above with reference to FIG. 6, a polymer substrate 120 transferred to a transfer medium 200 may be finally printed onto a target substrate 300, for example, substrates of plastic, paper, tape, fabric, and other materials, as shown in FIG. 7. Further, since the polymer substrate 120 has high flexibility, the target substrate 300 may include not only a flat substrate but also a round substrate. Here, in order to allow the polymer substrate 120 to be easily printed from the transfer medium 200 to the target substrate 300, a surface 310 of the target substrate 300 to be printed may exhibit high adhesive strength, and a separate adhesive material may be deposited on the surface of the target substrate in order to enhance adhesive strength.

Meanwhile, before transferring the polymer substrate 120 to the transfer medium 200, a desired device may be previously formed on the polymer substrate 120, as described above. Thus, even when the target substrate 300 is vulnerable to physical and chemical environments in the process of directly forming the device on the target substrate 300, the device may be easily formed on the target substrate 300 without being affected by the properties of the target substrate 300.

Next, the present invention will be described with reference to preferred examples. However, it should be understood that these examples are provided for illustration only and are not intended to limit the scope of the present invention.

Example 1

Preparation and Transfer Substrate for Transfer Printing

Preparation of Handling Substrate Having Concave-Convex Structure Thereon a) A silicon (Si) substrate was cleaned sequentially using acetone, isopropyl alcohol (IPA) and deionized water, followed by drying at 110° C. for 1 minute. HMDS (AZ AD Promoter-K, 4000 rpm, 35 sec.) and a photoresist (PR) (AZ 1512, 4000 rpm, 35 sec.) were sequentially coated on the silicon substrate, and the photoresist was subjected to patterning through a chromium mask (Supermask Co., Ltd.) by 365 nm optical lithography, followed by development with a water-based basic developer (AZ 500 MIF, AZ Electronics Materials) to form a photoresist having a hole pattern.

b) The silicon substrate was etched by reactive ion etching (RIE; Vacuum Science, 50 mTorr, 40 sccm $SF_6$, 50 W, 7 min.), and the remaining photoresist was removed using acetone and piranha solution ($H_2SO_4:H_2O_2$=3:1, 5 min.) to form a concave-convex structure pattern on the surface of the silicon substrate.

Formation of Sacrificial Layer c) A 200 nm thick $SiO_2$ layer was deposited on the silicon substrate having the concave-convex structure by sputtering (Korea Vacuum Tech., Ar=15 sccm, 5 mTorr, 100 W) or PECVD (Oxford, gas flow: $SiH_4$=160 sccm, $N_2O$=730 sccm, 300° C.).

Formation and Patterning of Polymer Substrate d) An SU-8 photoresist (MICRO CHEM, SU-8 2002, SU-8 2010 or SU-8 2100) was deposited to a thickness of about 14 µm by spin coating at 3000 rpm for 10 seconds, followed by baking at 95° C. for 1 minute. Then, the SU-8 photoresist was subjected to pattering by UV-lithography (CA-6M, SHINU MST, Illumination: 8.5 mW/cm$^2$, 5 sec.), followed by baking at 95° C. for 1 minute and development for 30 seconds with a water-based basic developer (MICRO CHEM, SU-8 developer) to form a patterned polymer (SU-8) substrate.

Removal of Sacrificial Layer e) The $SiO_2$ layer was removed by etching with a HF solution (DC Chemical Co. Ltd, HF 49%, 60 min.).

Transfer f) A PDMS (polydimethylsiloxane, Sylgard 184, Dow Corning Co., Ltd.) stamp was brought into contact with the polymer (SU-8) substrate and then separated from the handling substrate (silicon substrate) to transfer the polymer substrate to the PDMS stamp.

Figure 8:
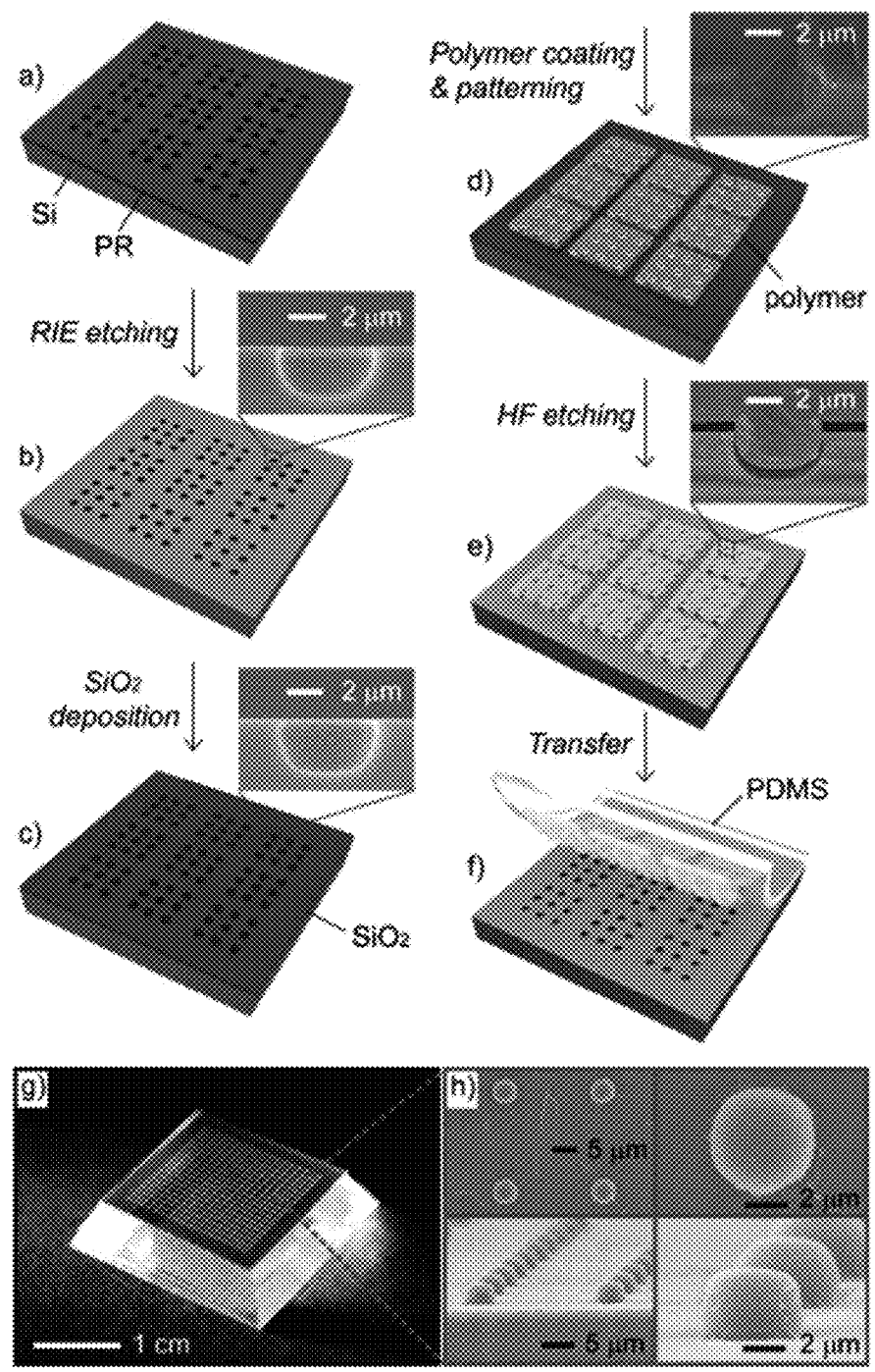
FIG. 8 is a schematic diagram of a process of manufacturing a substrate for transfer printing according to Example 1 and SEM images of resulting products.

FIG. 8 is a schematic diagram of a process of manufacturing a substrate for transfer printing according to Example 1 and SEM images of resulting products Referring to FIG. 8, it can be seen that a concave portion having a pot-shaped longitudinal cross-section, an inlet of which is slightly smaller than a belly thereof, is formed on the handling substrate (silicon substrate) (b), and that the $SiO_2$ layer was formed along the concave-convex structure to act as the sacrificial layer (c~e). In addition, it can be seen that the polymer (SU-8) substrate was supported by the bumps formed on the lower surface thereof and inserted into the concave portion of the handling substrate, whereby the polymer substrate was maintained at an original place even after the sacrificial layer ($SiO_2$ layer) was removed (e). Further, it can be seen that the polymer substrate was easily transferred from the handling substrate to the PDMS stamp only by Van der Waal's force with the PDMS stamp (f, g). Further, the polymer substrate has the bumps having the shape corresponding to the concave portion of the handling substrate (e,h).

Example 2

Measurement of Alignment and Transfer Yield

Various concave-convex structures were formed by changing the shape, depth and pitch of the concave portion of the concave-convex structure according to the procedure of Example 1.

Figure 9:
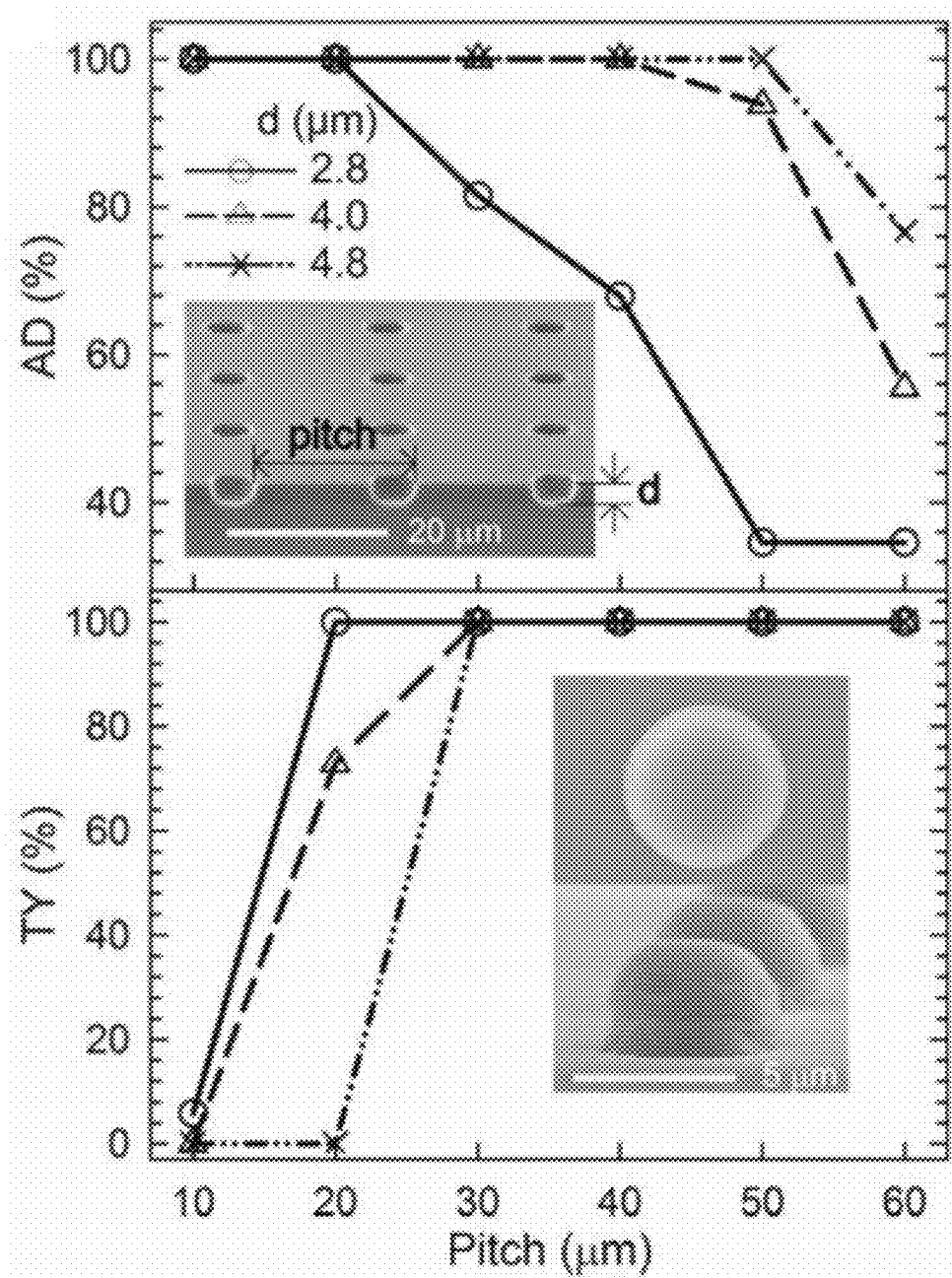
FIGS. 9 and 10 are graphs depicting a degree of alignment and transfer yield of a polymer substrate depending on the shape, depth and pitch of a concave portion of a concave-convex structure.
Figure 10:
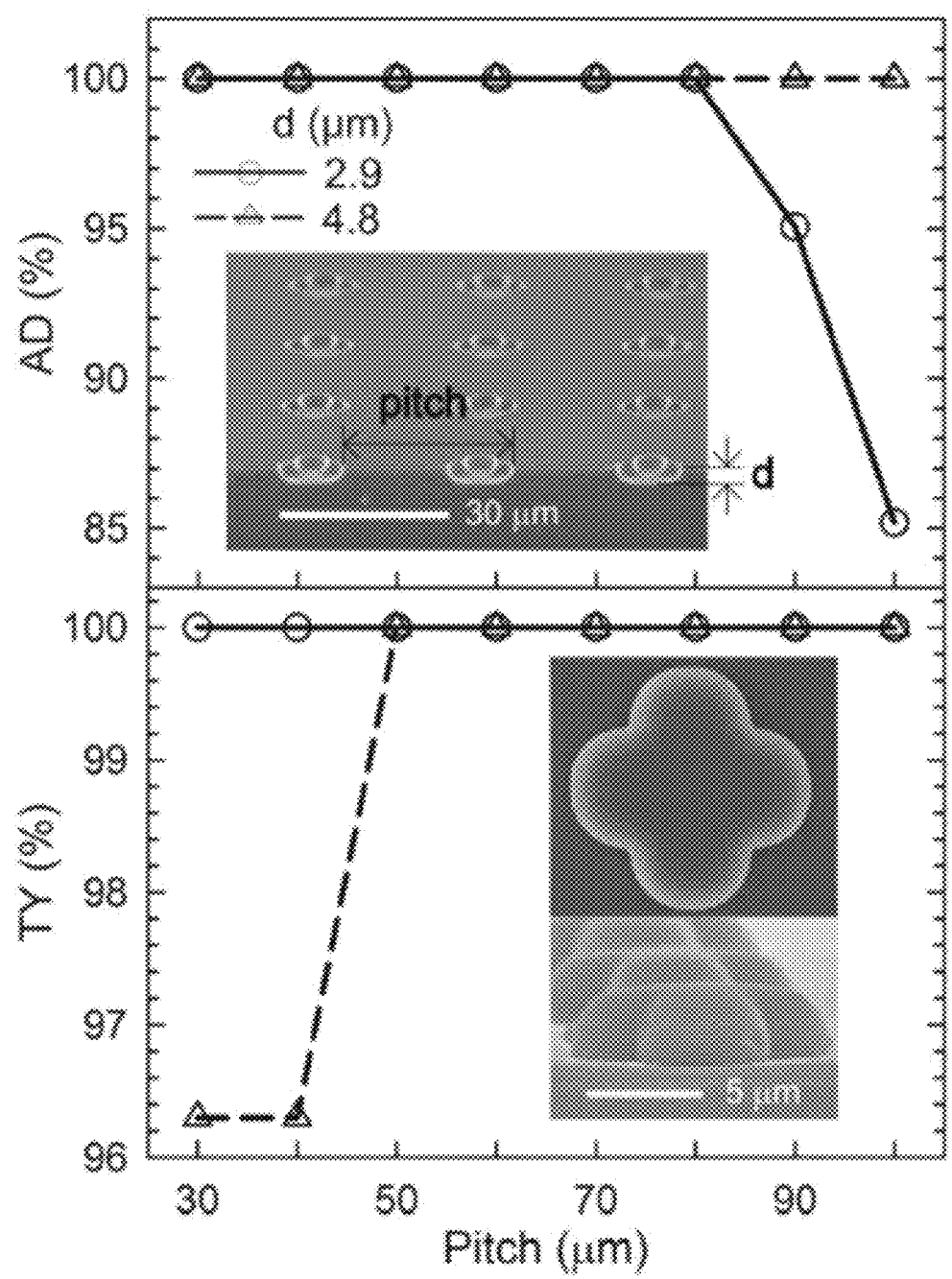

FIGS. 9 and 10 are graphs depicting degree of alignment (AD) and transfer yield (TY) of a polymer substrate depending on the shape, depth (d) and pitch of a concave portion of a concave-convex structure (here, AD=(Number of polymer substrates on handling substrate after removal of sacrificial layer/Number of polymer substrates before removal of sacrificial layer)×100; and TY=(Number of polymer substrates transferred to PDMS/Total number of polymer substrates on handling substrate before being transferred to PDMS)×100). Images on the graphs were obtained by photographing the handling substrate having the concave-convex structure thereon and the bumps of the polymer substrate.

FIG. 9 shows the degree of alignment and the transfer yield when the concave portion of the concave-convex structure has a circular shape (in top view of the concave portion). From FIG. 9, it can be seen that, as the pitch decreases and the depth increases, the degree of alignment increases but the transfer yield decreases due to increased adhesion force between the concave portion of the handling substrate and the polymer substrate. However, both the degree of alignment and the transfer yield were 100% at least at a pitch of 20 µm for a depth of 2.8 µm, at a pitch of 30~40 µm for a depth of 4.0 µm, and at a pitch of 30~50 µm for a depth of 4.8 µm.

FIG. 10 shows the degree of alignment and the transfer yield when the concave portion of the concave-convex structure has a cross shape (in top view of the concave portion), which provides similar tendency to the case in which the concave portion has a circular shape. However, it can be seen that both the degree of alignment and the transfer yield satisfied 100% in a wider range of the pitch (at a pitch of 30-80 µm for a depth of 2.9 µm and at a pitch of 50-100 µm for a depth of 4.0 µm) in the case where the concave portion has a cross shape than in the case where the concave portion has a circular shape. That is, it can be seen that the cross-shaped concave portion is more geometrically efficient in terms of degree of alignment and transfer yield than the circular concave portion.

Thus, it is possible not only to adjust the degree of alignment and the transfer yield to desired values while securing a complete value of 100% in both the degree of alignment and the transfer yield through control of the shape of the concave-convex structure.

Meanwhile, although the analysis in this example is based on the transfer yield by the PDMS stamp, the transfer yield may be further enhanced when using a stronger adhesive transfer medium.

Example 3

Transfer Printing to Target Substrate to be Printed

Polymer substrates were formed in patterns having various shapes and sizes on handling substrates according to the procedure of Example 1. Then, the polymer substrates were transferred to transfer mediums, followed by printing the polymer substrates on various target substrates.

Figure 11:
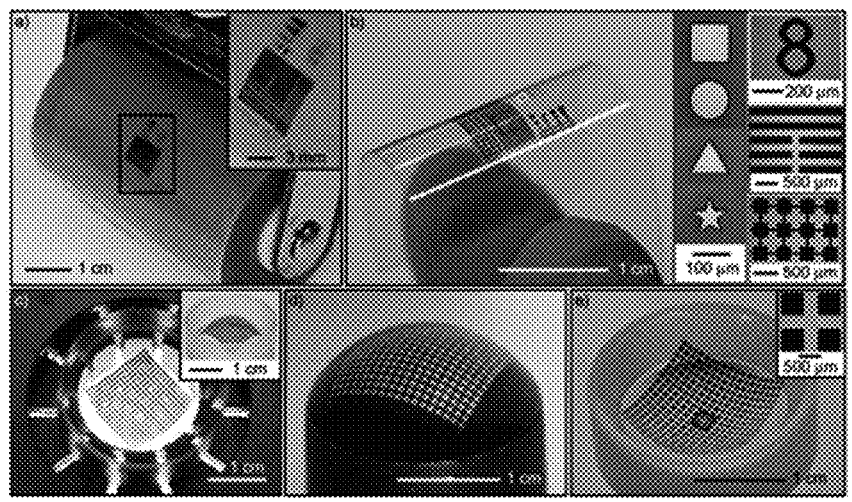
FIG. 11 shows optical micrographs of polymer substrates transferred to a transfer medium and polymer substrates printed on target substrates.

FIG. 11 shows optical micrographs of a polymer substrate (a) transferred to a transfer medium and polymer substrates (b~e) printed on target substrates As shown in FIG. 11, the polymer substrates patterned to various sizes and shapes were transferred to a roller stamp with PDMS attached thereto (a), and it can be seen that the polymer substrates were printed on a flexible substrate such as a PET film while maintaining a high degree of alignment (b). This shows that the present invention can be applied to a roll-to-roll process for a large area of devices. Further, since the polymer substrates can be printed along a round shape of a target substrate without deteriorating the degree of alignment (c~e), this result suggests applicability to various types of substrates having non-planar structures.

Example 4

Preparation and Transfer Printing of Organic Light Emitting Devices

After preparing polymer substrates in an array of 8×8 according to the procedure of Example 1, organic light emitting devices were fabricated on a polymer substrate. Then, the organic light emitting devices were transferred to a PDMS stamp and then printed on a flexible plastic substrate.

Figure 12:
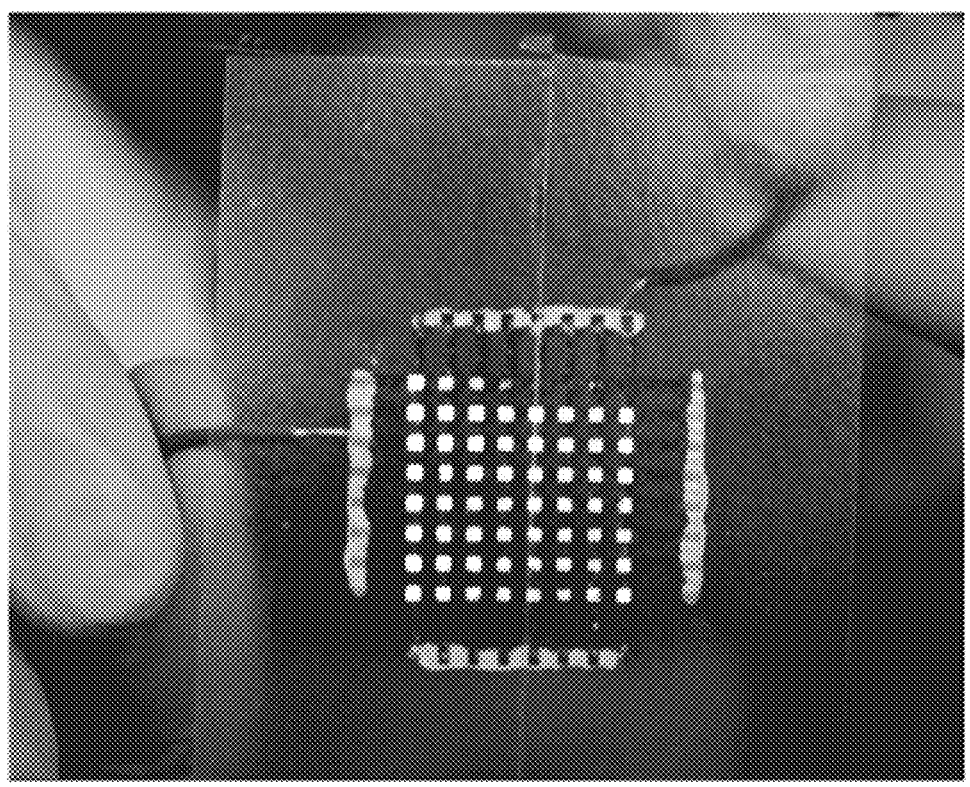
FIG. 12 is a picture of organic light emitting devices prepared in Example 4.

FIG. 12 is a picture of organic light emitting devices prepared in Example 4. As shown in FIG. 12, all of the organic light emitting devices in the pixels were transfer-printed while maintaining an initial degree of alignment and emitted light upon application of electric current. In other words, the substrate for transfer printing according to the present invention allows the devices to be previously formed on the polymer substrate and to be easily transfer-printed to a target substrate, thereby preventing a possibility of damaging the target substrate in a process of manufacturing the devices.

Further, in the procedure of this example, since the sacrificial layer is removed before manufacturing the devices, there is no damage of the devices due to a corrosive etching solution (for example, HF solution) used in removal of the sacrificial layer.

Example 5

Preparation and Transfer Printing of Devices for Transfer Printing

A procedure similar to that of the Example 1 was performed. In this example, a water soluble polymer (PAA or dextran) was deposited as a material for a sacrificial layer on a silicon substrate having a concave-convex structure thereon by spray coating or spin coating, and ZnO-TFTs were formed on the polymer substrate before removal of the sacrificial layer. Then, the sacrificial layer was removed using water as an etching solution.

Further, after transferring the polymer substrate and the ZnO-TFTs to the PDMS stamp, the polymer substrate and the ZnO-TFTs were printed onto a target substrate.

Figure 13:
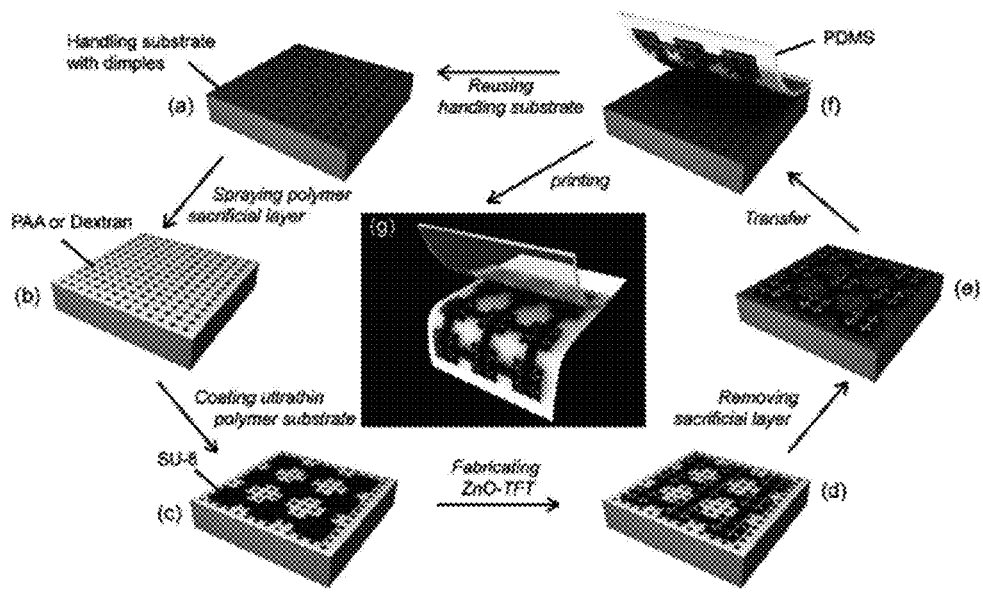
FIG. 13 is a schematic flow diagram of a process of manufacturing and transferring electronic devices for transfer printing in Example 5.

FIG. 13 is a schematic flow diagram of a process of manufacturing and transferring an electronic device for transfer printing in Example 5.

As shown in FIG. 13, when the water soluble polymer (PAA or dextran) was used as the material for the sacrificial layer (b), water may be used as an etching solution to facilitate removal of the sacrificial layer (d~e). Thus, when the devices are formed before the sacrificial layer is removed (c~d), water is used as the etching solution, thereby preventing the devices from being damaged in the course of etching the sacrificial layer. Further, after the transfer-printing process, the remaining handling substrate may be reused by washing with a piranha solution and water (f~e).

Figure 14:
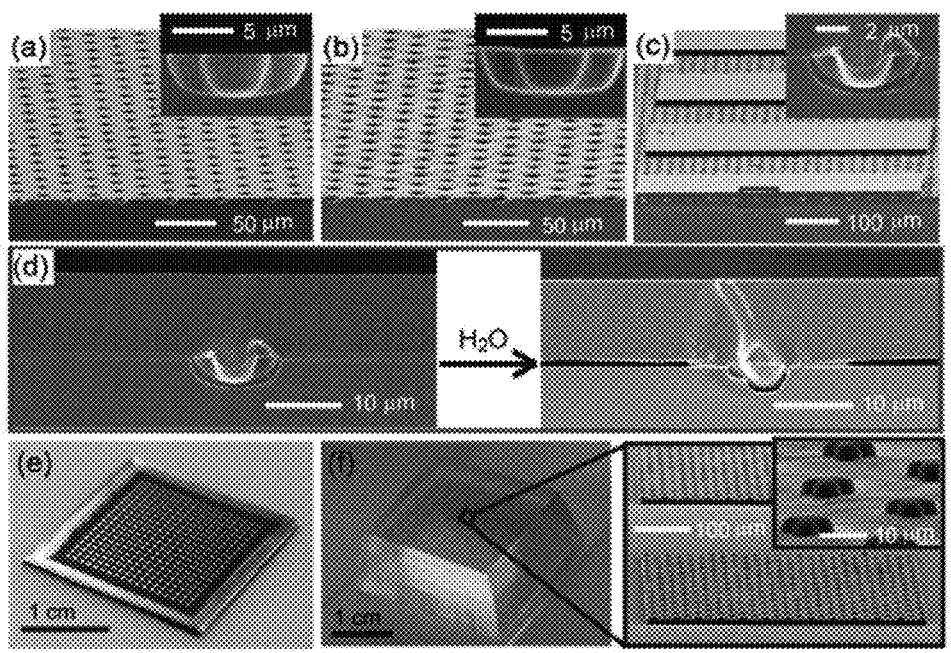
FIG. 14 shows SEM images of resulting products in each step of the process in Example 5.

FIG. 14 shows SEM images of resulting products in the respective steps of the process in Example 5.

In FIG. 14, (a) shows a concave-convex structure having a cross-shaped concave portion (pitch=20 μm, width=13 μm, depth=3.9 μm) formed on a silicon substrate, (b) shows a water soluble polymer layer formed along the concave-convex structure, and (c) shows a ultrathin polymer substrate formed on the silicon substrate on which the water soluble polymer layer was formed.

In FIG. 14, (d) shows the concave portion before removing the water soluble polymer layer (sacrificial layer) (left side) and after removing the water soluble polymer layer (right side). It can be seen that the water soluble polymer remained inside and around the concave portion due to phase confinement effects even when the water soluble polymer layer was removed. Further, it can also be seen that the polymer substrate could be easily transferred from the handling substrate to the PDMS stamp (e), and that the polymer substrate is provided with bumps having the shape corresponding to the shape of the concave portion of the handling substrate (f).

Example 6

Measurement of Degree of Alignment and Transfer Yield

In the procedure of Example 5, experiments have been conducted to determine optimal conditions for the degree of alignment and transfer yield according to coating of the sacrificial layer (in this procedure, the step of forming ZnO-TFTs was eliminated).

Figure 15A:
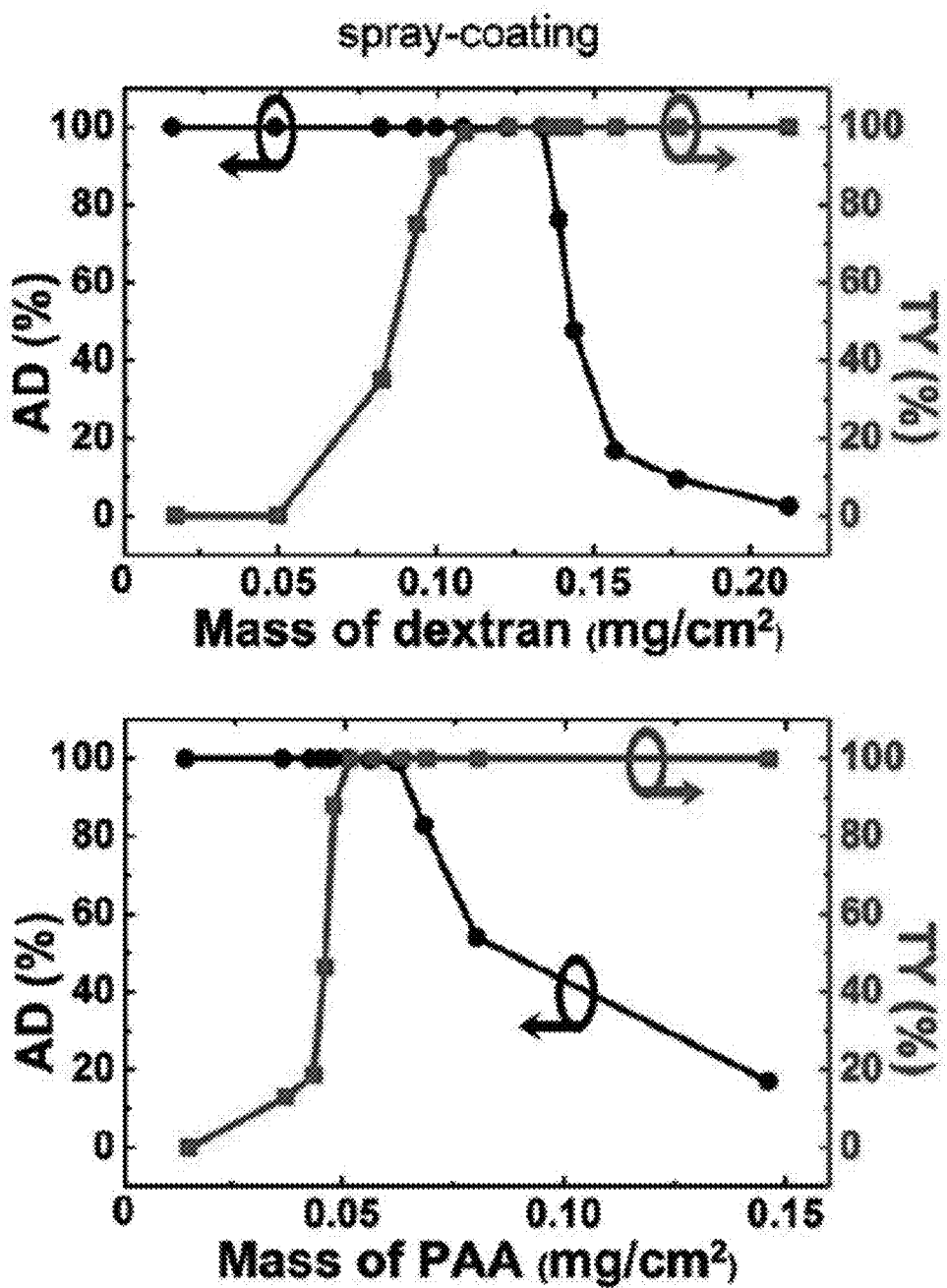

Dextran (MW=70,000 g/mol, 2 wt % aqueous solution) and PAA (MW=50,000 g/mol, 2 wt % aqueous solution, PAA solution was neutralized with NaOH before use) were deposited in various amounts on the silicon substrate having a cross-pattern by spray coating and spin coating FIGS. 15a and 15b are graphs depicting the degree of alignment (AD) and the transfer yield (TY) measured in Example 6.

When dextran was deposited in an amount of 0.01 mg/cm$^2$~0.08 mg/cm$^2$ as the material for the sacrificial layer on the silicon substrate by spray coating, the sacrificial layer could not completely cover the silicon substrate. In this case, TY was 0 or very low. This is because the silicon substrate directly contacted the polymer (SU-8) substrate to exhibit strong adhesion at a portion free from the sacrificial layer, thereby making it difficult to separate the polymer substrate from the silicon substrate.

When dextran was deposited in an amount of 0.20 mg/cm$^2$ on the silicon substrate by spray coating, most interior space of the concave portion formed on the silicon substrate was filled with the sacrificial layer. In this case, AD approached 0. This is because the interior space of the concave portion was filled with the dextran used in an excessive amount and the bumps corresponding to the concave portion were not formed on the polymer (SU-8) substrate, so that the phase confinement effects were damaged, thereby allowing the polymer substrate to be deviated from an original place upon removal of the sacrificial layer.

When dextran was deposited in an amount of 0.11~0.13 mg/cm$^2$ by spray coating, both AD and TY were 100%. Further, when PAA was deposited in an amount of 0.05 mg/cm$^2$~0.06 mg/cm$^2$ by spray coating, both AD and TY were 100% (FIG. 15a).

Meanwhile, when dextran and PAA were spin-coated in amounts of 0.30 mg/cm$^2$~0.41 mg/cm$^2$ and 0.19 mg/cm$^2$~0.21 mg/cm$^2$, respectively, both AD and TY were 100% (FIG. 15b).

Example 7

Measurement of Degree of Alignment and Transfer Yield

In the procedure of Example 5, experiments have been conducted to determine optimal conditions for the degree of alignment and the transfer yield according to etching of the sacrificial layer (in this procedure, the step of forming ZnO-TFTs was eliminated).

When the sacrificial layer was etched for a period of less than 15 minutes, AD was 100% but TY was low. However, when the sacrificial layer was sufficiently etched for a period of 30 minutes or more, both AD and TY were 100%, and when the sacrificial layer was etched for 5 hours, the same results were obtained.

On the other hand, when a handling substrate free from the concave-convex structure was used as a comparative example, AD and TY could not reach 100% irrespective of etching duration (Comparative Example 1).

Figure 16:
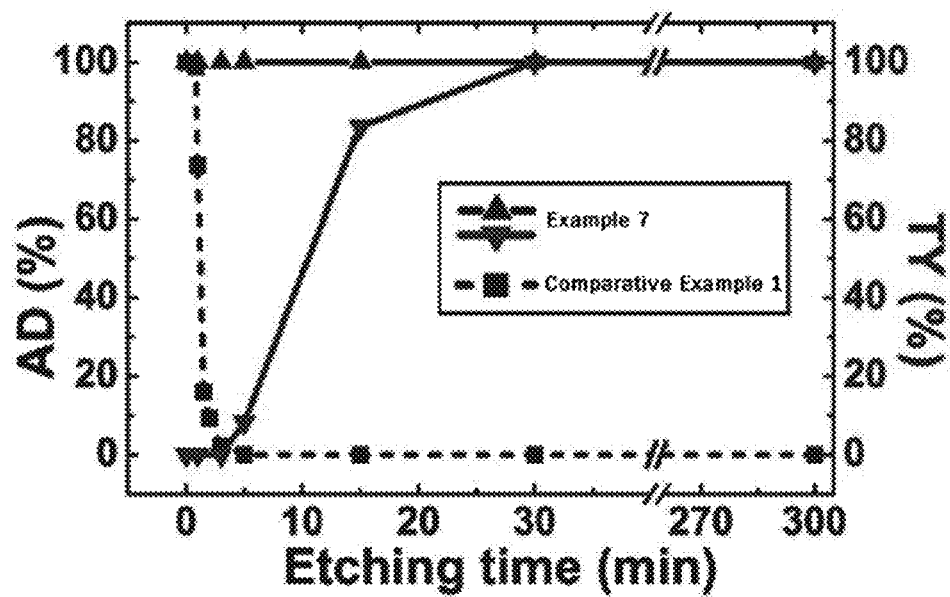
FIG. 16 is a graph depicting degree of alignment (AD) and transfer yield (TY) measured in Example 7 and Comparative Example 1.

Results of Example 1 and Comparative Example 1 are shown in FIG. 16.

Example 8

Transfer Testing

In the procedure of Example 5, the polymer substrates were formed in patterns of various sizes and shapes on the handling substrate. Then, the polymer substrates were transferred to a transfer medium (PDMS stamp).

Figure 17:
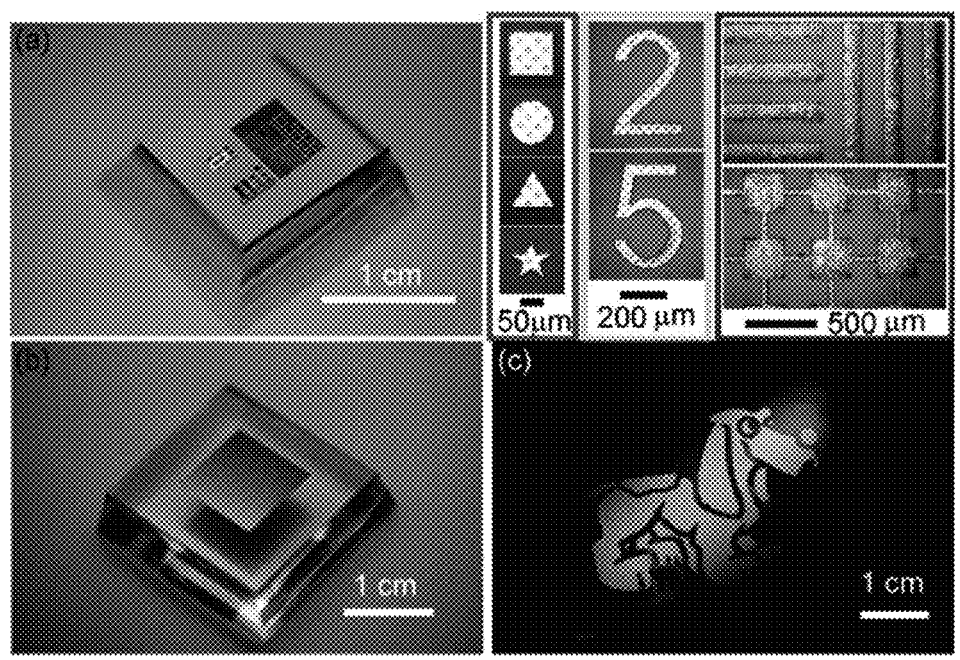
FIG. 17 shows optical micrographs of polymer substrates transferred to transfer media in Example 8.

FIG. 17 shows optical micrographs of polymer substrates transferred to transfer media in Example 8. As shown in FIG. 17, it can be seen that the polymer substrates patterned to various sizes and shapes were completely transferred without changing the degree of alignment.

Example 9

Preparation and Characteristics Analysis of ZnO-TFT

In the procedure of Example 5, ZnO-TFTs were prepared by sequentially depositing aluminum (thickness=100 nm) for a source electrode and a drain electrode, ZnO (thickness=80 nm) for a channel layer, c-PVP (thickness=200 nm) for an insulation layer, and aluminum (thickness=100 nm) for a gate electrode on a polymer (SU-8) substrate (thickness=11 μm). Then, the prepared ZnO-TFTs were transfer-printed together with the polymer substrate onto a target substrate, followed by observation of electric characteristics of the device.

Figure 18:
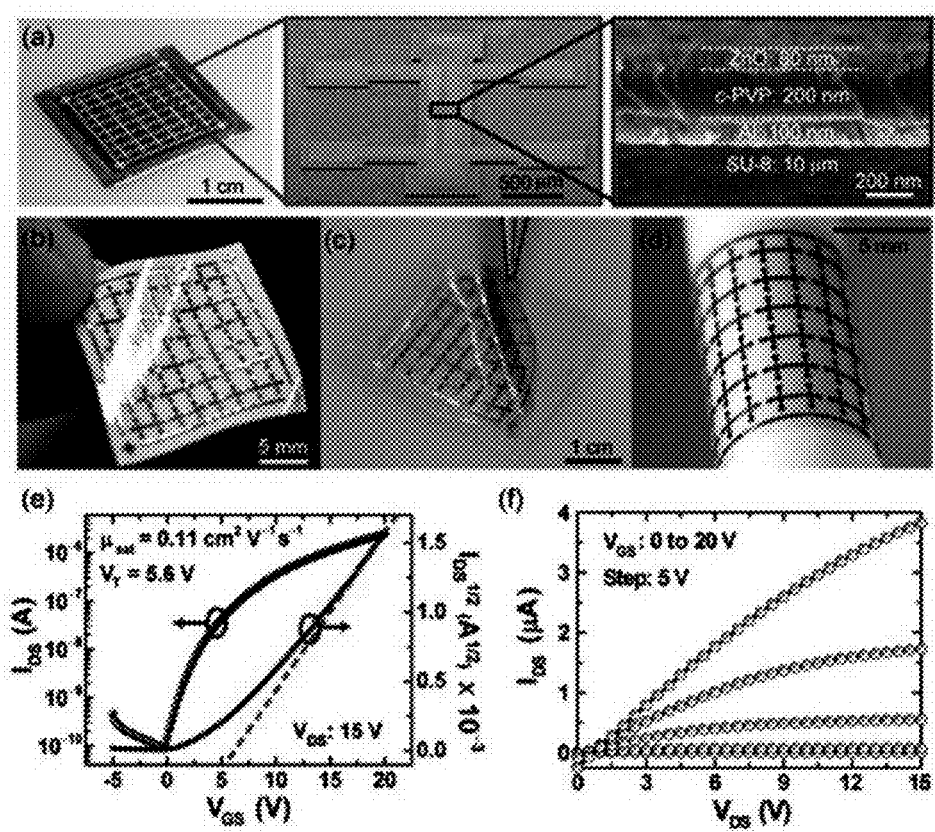
FIG. 18 shows pictures and graphs depicting characteristics of devices for transfer printing, which includes a ZnO-TFT array according to Example 9.

FIG. 18 shows pictures and graphs depicting characteristics of devices for transfer printing, which includes a ZnO-TFT array according to Example 9.

In FIG. 18, (a) shows the ZnO-TFT array and a ZnO TFT unit formed on the silicon substrate, and (b) shows the ZnO-TFT array printed on a sheet of adhesive paper after being transferred to a PDMS stamp. (c) and (d) are pictures of applicability to a stick-and-play system, in which the ZnO-TFT array was transferred to a temporary sticker (c), and the sticker was attached to a rounded object (d).

FIGS. 18 (e) and (f) are graphs depicting electrical performance of the ZnO-TFTs transfer-printed onto a sheet of paper. A ZnO-TFT formed on an ultrathin polymer substrate (thickness: 10 μm) had an electron mobility of 0.11 $cm^2/V\cdot sec$. This mobility is similar to the electron mobility of a ZnO-TFT formed on a 200 μm thick polymer substrate, which has been studied in other research groups. Meanwhile, the devices had a threshold voltage of 5.6V, and an On/Off voltage ratio of $10^4$ upon application of 15V ($V_{DS}$), which was 10 to 100 times higher than devices directly formed on a plastic substrate.

Further, the ZnO-TFTs were transfer-printed onto a PET (polyethylene terephthalate) film, followed by observation of characteristics of the devices according to the degree of bending.

Figure 19:
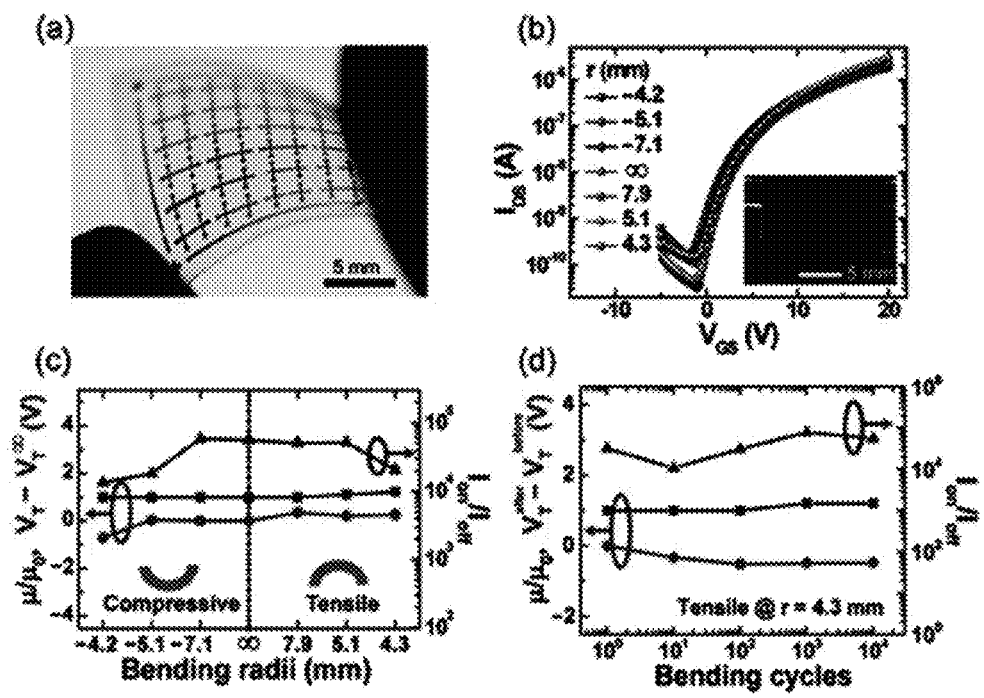
FIG. 19 shows a picture of a ZnO-TFT array transfer-printed on a PET film and graphs depicting variation of characteristics of the ZnO-TFT array depending on the degree of bending.

FIG. 19 shows a picture of a ZnO-TFT array transfer-printed on a PET film and graphs depicting variation of characteristics of the ZnO-TFT array depending on the degree of bending As shown in FIG. 19, it was possible to secure high flexibility and handling stability by transfer-printing the ZnO-TFTs on a transparent PET film (a). As measured before bending the device, the electron mobility, the threshold voltage, and the on/off voltage ratio of the devices were $0.09\pm0.025$ $cm^2V^{-1}S^{-1}$, $5.4\pm0.6$ V, and $(1\pm0.72)\times10^5$, respectively. The characteristics of the devices were observed in the case in which the curvature of radius of the devices was gradually changed from −4.2 mm (compressed state) to 4.3 mm (extended state) (b), and in the case in which the devices were repeatedly subjected 10000 times to extension to 4.3 mm and returning back to a planar state. As the electrical characteristics of the devices, a relative mobility was less than 22%, variation of the threshold voltage ranged from −0.7 to 0.35V, and the on/off voltage ratio was $10^4$ or more (c, d). Accordingly, it can be seen that performance of the devices could be stably maintained despite the radius of curvature and repeated bending. Here, device damage or isolation of charges can occur due to penetration of moisture and oxygen into the gate insulation layer in the course of repeated bending, whereby performance of the devices can be changed.

Although some embodiments have been described herein, it should be understood by those skilled in the art that these embodiments are given by way of illustration only, and that various modifications, variations and alterations can be made without departing from the spirit and scope of the invention.

What is claimed is:

1. A method for fabricating a substrate for transfer printing, comprising:
    preparing a handling substrate having a concave-convex structure formed thereon;
    forming a sacrificial layer along the concave-convex structure on the handling substrate;
    coating a polymer on the handling substrate having the sacrificial layer formed thereon to form a polymer substrate having bumps filling a concave portion of the concave-convex structure;
    removing the sacrificial layer from the handling substrate, wherein the concave portion of the concave-convex structure has a pot-shaped longitudinal cross-section, an inlet of which is smaller than a belly thereof.

2. The method according to claim 1, further comprising:
    patterning the polymer substrate to divide the polymer substrate before removing the sacrificial layer.

3. The method according to claim 1, wherein the concave-convex structure is formed by etching the handling substrate through reactive ion etching.

4. The method according to claim 1, wherein the sacrificial layer formed on an upper surface of the convex portion of the concave-convex structure is thicker than the sacrificial layer formed on a lower surface of the concave portion of the concave-convex structure.

5. The method according to claim 1, wherein the coating a polymer is performed using a solution process.

6. The method according to claim 1, wherein the removing the sacrificial layer is performed by wet etching.

7. The method according to claim 1, wherein the sacrificial layer is composed of a water soluble polymer, and the removing the sacrificial layer is performed using water.

8. The method according to claim 7, wherein, after removing the sacrificial layer, the water soluble polymer remains at least within the concave portion of the concave-convex structure.

9. The method according to claim 7, wherein the removing the sacrificial layer comprises adjusting interfacial adhesion between the handling substrate and the polymer substrate by adjusting a degree of etching the water soluble polymer using water.

10. A method for fabricating an electronic device for transfer printing, comprising:
    preparing a handling substrate having a concave-convex structure formed thereon;
    forming a sacrificial layer along the concave-convex structure on the handling substrate;
    coating a polymer on the handling substrate having the sacrificial layer formed thereon to form a polymer substrate having bumps filling a concave portion of the concave-convex structure; and
    removing the sacrificial layer from the handling substrate, wherein an electronic device is formed on the polymer substrate before or after removing the sacrificial layer, and wherein the concave portion of the concave-convex structure has a pot-shaped longitudinal cross-section, an inlet of which is smaller than a belly thereof.

11. The method according to claim 10, further comprising:
patterning the polymer substrate to divide the polymer substrate before removing the sacrificial layer.

12. The method according to claim 10, wherein the concave-convex structure is formed by etching the handling substrate through reactive ion etching.

13. The method according to claim 10, wherein the sacrificial layer formed on an upper surface of the convex portion of the concave-convex structure is thicker than the sacrificial layer formed on a lower surface of the concave portion of the concave-convex structure.

14. The method according to claim 10, wherein the coating a polymer is performed using a solution process.

15. The method according to claim 10, wherein the removing the sacrificial layer is performed by wet etching.

16. The method according to claim 10, wherein the sacrificial layer is composed of a water soluble polymer, and the removing the sacrificial layer is performed using water.

17. A method for fabricating a substrate for transfer printing, comprising:
preparing a handling substrate having a concave-convex structure formed thereon;
forming a sacrificial layer along the concave-convex structure on the handling substrate;
coating a polymer on the handling substrate having the sacrificial layer formed thereon to form a polymer substrate having bumps filling a concave portion of the concave-convex structure;
removing the sacrificial layer from the handling substrate,
wherein the sacrificial layer formed on an upper surface of the convex portion of the concave-convex structure is thicker than the sacrificial layer formed on a lower surface of the concave portion of the concave-convex structure.

18. The method according to claim 17, further comprising:
patterning the polymer substrate to divide the polymer substrate before removing the sacrificial layer.

19. The method according to claim 17, wherein the concave-convex structure is formed by etching the handling substrate through reactive ion etching.

20. The method according to claim 17, wherein the coating a polymer is performed using a solution process.

* * * * *